United States Patent [19]

Enomoto et al.

[11] Patent Number: 4,703,202
[45] Date of Patent: Oct. 27, 1987

[54] TWO-STAGE GATE CIRCUIT PROVIDING INVERTED AND NON-INVERTED OUTPUTS

[75] Inventors: Hiromu Enomoto, Kawasaki; Yasushi Yasuda, Machida; Akinori Tahara, Zushi; Masao Kumagai, Tokyo, all of Japan

[73] Assignee: Fujitsu Limited, Kanagawa 211, Japan

[21] Appl. No.: 700,413

[22] Filed: Feb. 11, 1985

[30] Foreign Application Priority Data

Feb. 13, 1984 [JP] Japan .................................. 59-022966

[51] Int. Cl.⁴ .................. H03K 19/013; H03K 19/088
[52] U.S. Cl. ..................................... 307/443; 307/446; 307/456; 307/458; 307/480
[58] Field of Search ................... 307/200 A, 443, 446, 307/454, 456–458, 475, 480, 269, 591, 595, 601, 602, 605

[56] References Cited

U.S. PATENT DOCUMENTS

| 3,962,589 | 6/1976 | Priel et al. ....................... 307/443 X |
| 4,237,388 | 12/1980 | Nokubo et al. ................... 307/475 X |
| 4,424,455 | 1/1984 | Neely ............................. 307/446 X |
| 4,529,896 | 7/1985 | Grandguillot et al. ............. 307/480 |

FOREIGN PATENT DOCUMENTS 0092040 7/1980 Japan .................................. 307/458

OTHER PUBLICATIONS

IBM Technical Disclosure Bulletin, Vol. 26, No. 7A, Dec. 1983, K. S. Daghir et al. "New True-Complement Generator with Faster-Going Positive Output" pp. 3247–3248.

Primary Examiner—Stanley D. Miller
Assistant Examiner—D. R. Hudspeth
Attorney, Agent, or Firm—Armstrong, Nikaido, Marmelstein & Kubovcik

[57] ABSTRACT

A gate circuit used for controlling an interface circuit in a microcomputer system, including a first-stage gate circuit, a second-stage gate circuit, and a control device connected between the first-stage gate circuit and the second-stage gate circuit. The first-stage gate circuit outputs an inverted strobe signal to the interface circuit, and the second-stage gate circuit outputs a non-inverted strobe signal to the interface circuit. Although there is a time lag in the changeover timing of these strobe signals, this time lag is reduced by connected the diode between the first-stage gate circuit and the second-stage gate circuit.

11 Claims, 8 Drawing Figures

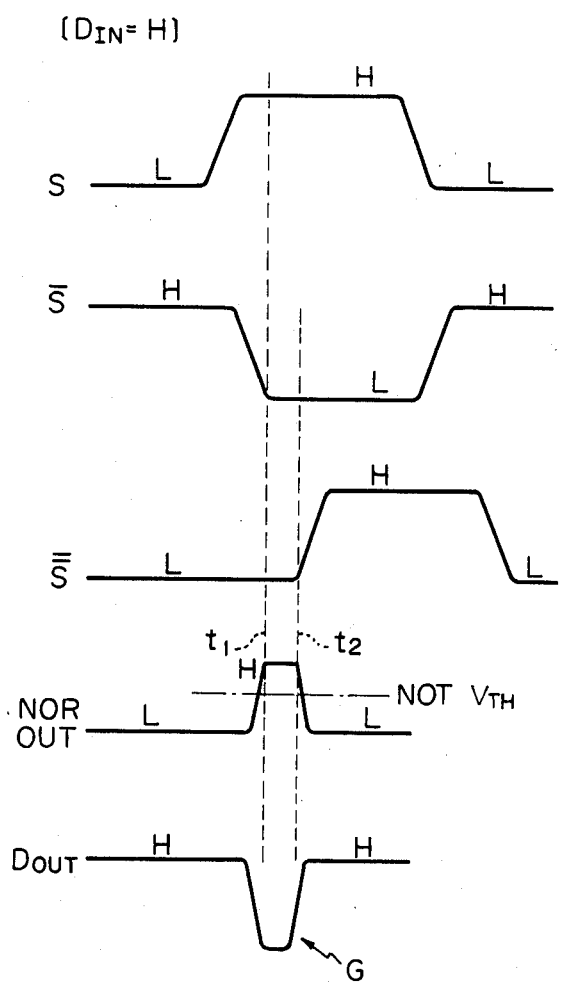

TWO-STAGE GATE CIRCUIT PROVIDING INVERTED AND NON-INVERTED OUTPUTS

BACKGROUND OF THE INVENTION

1. Field of the Invention

The present invention relates to a gate circuit, more particularly to a gate circuit constituted, for example, by a set of a transistor-coupled transistor logic (TTL) and a diode-transistor logic (DTL), which is advantageously used in a microcomputer system.

2. Description of the Related Art

As is well known, in a microcomputer system, a plurality of interface circuits are provided between a central processing unit (CPU) and a read-only memory (ROM), random-access memory (RAM), and input-/output (I/O) unit through a data bus line. Each interface circuit has, for example, a plurality of set/reset latch circuits (SRL circuit) for controlling the writing or holding of data transmitted to the CPU. The timing for writing or holding data is controlled by an inverted strobe signal and a non-inverted strobe signal, each generated from the gate circuit. The gate circuit applies these signals in parallel to each of the SRL circuits. The SRL circuits are necessary to maintain a high level output at both "write" and "hold" modes in spite of a change of any strobe signals.

In the gate circuit, when the strobe signal is changed, for example, from a low level to a high level, the inverted signal is turned from a high level to a low level and the non-inverted signal is changed from the low level to the high level.

However, when the non-inverted signal is changed from the low level to the high level, there is a time lag in the changeover timing compared to the timing of the inverted signal. Therefore, there is an unexpected case wherein the non-inverted signal and the inverted signal are both low level simultaneously.

Due to this timing, a so-called "glitch" noise occurs from the output of the SRL circuits. This glitch noise results in data errors in the CPU and other circuits.

SUMMARY OF THE INVENTION

The primary object of the invention is to provide a gate circuit used for controlling an interface circuit in a microcomputer system.

Another object of the present invention is to provide a gate circuit constituted by, for example, a set of a TTL circuit and a DTL circuit enabling reduced glitch noise and thus reduced data errors in the microcomputer system.

In accordance with the present invention, there is provided a gate circuit for generating an inverted signal and a non-inverted signal of an input signal, including a first-stage gate circuit having a phase splitter transistor for reacting to change of a level of the input signal and an output circuit controlled by the phase splitter transistor and for ouputting the inverted signal; a second-stage gate circuit for receiving the inverted strobe signal of the first-stage gate circuit and for outputting the non-inverted signal; and a device, connected between a collector of the phase splitter transistor in the first-stage gate circuit and an input terminal in the second-stage gate circuit, for controlling a level at the input terminal in the second-stage gate circuit according to a level of the collector of the phase splitter transistor in the first-stage gate circuit.

In accordance with the structure of the present invention, it is possible to considerably reduce glitch noise output from an SRL circuit used as an interface circuit, thereby eliminating data errors and enabling high-speed calculation in a microcomputer system.

BRIEF DESCRIPTION OF THE DRAWINGS

In the drawings,

FIG. 4A is a timing chart explaining each strobe signal in the gate circuit shown in FIG. 2;

DESCRIPTION OF THE PREFERRED EMBODIMENTS

Before describing the preferred embodiments, an explanation will be given of a conventional gate circuit constituted by, for example, a set of TTL circuit and a DTL circuit.

Figure 1:
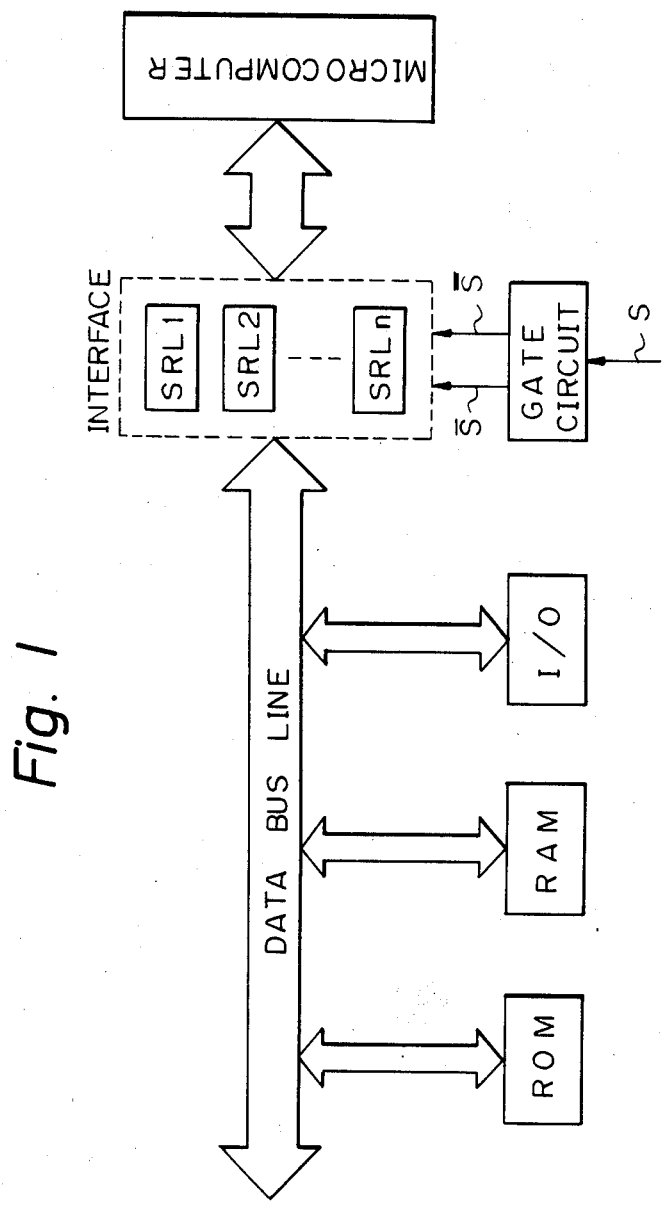
FIG. 1 is a schematic partial block diagram of a microcomputer system using a plurality of SRL circuits and a gate circuit.

Referring to FIG. 1, a plurality of SRL circuits (SRL1 to SRLn) used as the interface circuit are provided between the CPU and the ROM, RAM, and I/O circuit through the data bus line.

Figure 2:
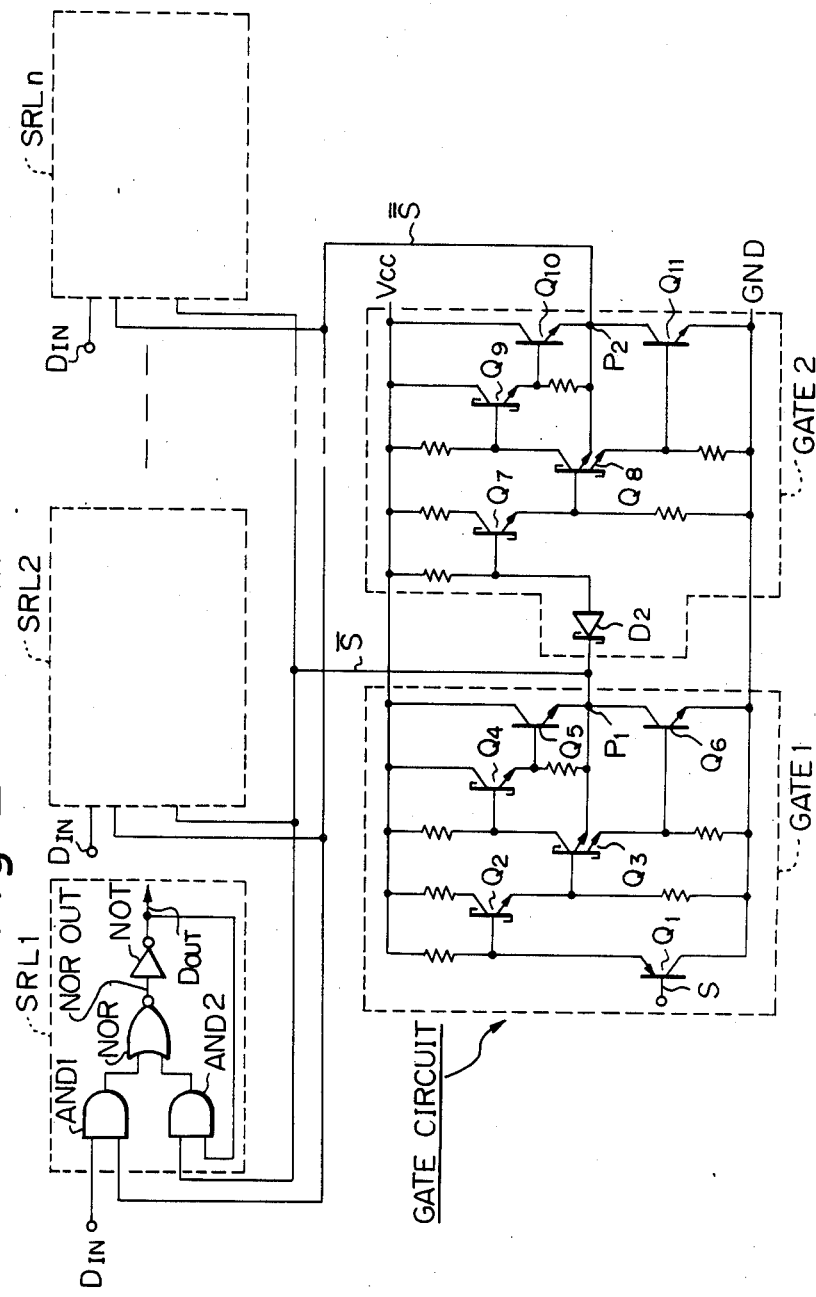
FIG. 2 is basic circuit diagram of a conventional gate circuit and a plurality of SRL circuits (SRL1 to SRLn) used as an interface circuit.

Referring to FIG. 2, each SRL circuit, for example, SRL1, basically includes two AND gates AND1 and AND2, a NOR gate NOR, and an inverter NOT. High-level (H) input data $D_{in}$ is applied to the one input terminal of the AND gate AND1 from the data bus line, and high-level output data $D_{out}$ is applied to the CPU through the data bus line. The operation mode of the SRL circuit SRL1 is changed by an inverted strobe signal and a non-inverted strobe signal between the "write mode" and "hold mode."

In the "write mode," the inverted strobe signal $\overline{S}$ is a low level and the non-inverted strobe signal $\overline{\overline{S}}$ is a high level. In the "hold mode," the signal $\overline{S}$ is a high level and the signal $\overline{\overline{S}}$ is a low level.

Although both signals $\overline{S}$ and $\overline{\overline{S}}$ are changed from the low level to the high level or from the high level to the low level according to selection, the output level $D_{out}$ should be maintained at the high level.

However, a problem occurs when the signal $\overline{S}$ is changed from the low level to the high level, as explained in detail hereinafter.

The gate circuit is constituted by, for example, a TTL circuit (gate 1) as the first-stage gate circuit and a DTL circuit (gate 2) as the second-stage gate circuit. A diode $D_2$ (in general, a Schottky barrier diode) is connected between the output transistor in the gate 1 and the input terminal in the gate 2. The gate 1 has the same circuit arrangement and elements as the gate 2 except for an input transistor $Q_1$ and the diode $D_2$. An output circuit is constituted by the transistors $Q_4$, $Q_5$, and $Q_6$ in the gate 1, and the transistors $Q_9$, $Q_{10}$, and $Q_{11}$ in the gate 2.

When a high- or low-level strobe signal $\overline{\overline{S}}$ transmitted from a clock generator (not shown) in the microcomputer is applied to the base of the input transistor $Q_1$ in the gate 1, the inverted strobe signal $\overline{S}$ of a low or high level corresponding to the signal S is output from the point $P_1$, and the signal $\overline{S}$ is applied to the one input terminal of the AND gate AND2 in the SRL circuit SRL1. Meanwhile, the non-inverted strobe signal $\overline{\overline{S}}$ of a high or low level corresponding to the signal S is output from the point $P_2$ in the gate 2, and the signal $\overline{\overline{S}}$ is applied to the other input terminal of the AND gate AND1 in the SRL circuit SRL1. As is obvious, the signal $\overline{\overline{S}}$ has the same phase as that of the signal S.

The signal changeover timings of the strobe signals S, $\overline{S}$, and $\overline{\overline{S}}$ are shown in FIG. 4A. As is obvious from the drawing, when the signal $\overline{S}$ is changed from the high level to the low level, the signal S is changed from the low level to the high level after a short period (time lag: $t_2-t_1$) passes. Accordingly, both strobe signals $\overline{S}$ and $\overline{\overline{S}}$ become a low level during this short period. When both the low-level signal $\overline{S}$ and $\overline{\overline{S}}$ are applied to the AND gates AND1 and AND2 in the SRL circuit SRL1, the output $D_{out}$ becomes low and the glitch noise G caused by this time lag occurs from the output $D_{out}$ as shown in $D_{out}$ of FIG. 4A during this short period ($t_2-t_1$).

Moreover, several loads (in general, about eight SRL circuits per one gate circuit are connected as a load) are connected in parallel to the output points $P_1$ and $P_2$. The more loads, the larger the capacitive load, and the larger the time lag of the signal $\overline{S}$.

As can be understood, the shorter this period ($t_2-t_1$), the smaller the glitch noise level G. Accordingly, the present invention provides a gate circuit enabling reduced glitch noise by shortening the time lag ($t_2-t_1$).

Figure 3:
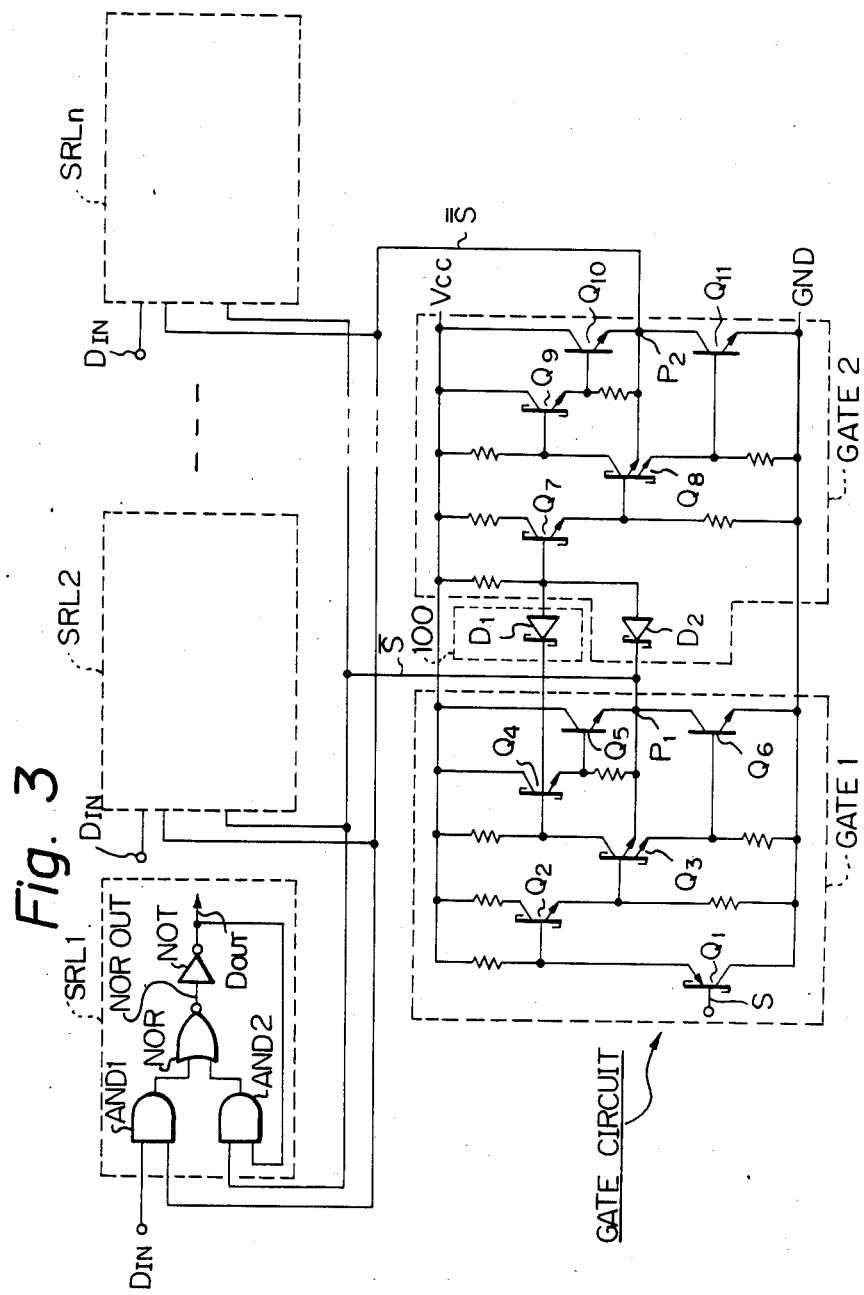
FIG. 3 is a basic circuit diagram of a gate circuit according to an embodiment of the present invention and the same plurality of SRL circuits as shown in FIG. 2.

Referring to FIG. 3, the gate circuit according to the present invention includes the same circuit arrangement and elements as the conventional gate circuit except that a diode $D_1$ as a one-directional element (for example, a Schottky barrier diode) is added between the collector of the transistor $Q_3$ and the input terminal of the gate 2, i.e., the base of the transistor $Q_7$. This diode $D_1$ operates as a control means 100 for controlling the input level of the second stage gate 2.

The operation of this gate circuit will be explained in detail below.

When, in the "hold mode" of the SRL circuit SRL1, the low-level strobe signal S is applied to the base of the input transistor $Q_1$, the transistor $Q_1$ is turned on because it is a pnp transistor. When the transistor $Q_1$ is turned on, the transistor $Q_2$, the phase splitter transistor $Q_3$, and the output transistor $Q_6$ are turned off, because these are npn transistors. Since the transistors $Q_4$ and $Q_5$ become high during the transient state, the level of the point $P_1$ becomes high, i.e., the strobe signal $\overline{S}$ is a high level.

Meanwhile, no current flows through the diodes $D_1$ and $D_2$ because both transistors $Q_3$ and $Q_6$ are turned off. Accordingly, the base of the transistor $Q_7$ becomes high and the transistor $Q_7$ is turned on, because it is an npn transistor. When the transistor $Q_7$ is turned on, the transistors $Q_8$ and $Q_{11}$ are turned on and the level of the point $P_2$ becomes low, i.e., the strobe signal $\overline{\overline{S}}$ is a low level (L).

Next, when, in the "write mode" of the SRL circuit SRL1, the low-level strobe signal S is changed to the high level, the transistor $Q_1$ is turned off and the transistors $Q_2$, $Q_3$, and $Q_6$ are turned on. Moreover, the transistors $Q_4$ and $Q_5$ are turned off. Accordingly, the level of the point $P_1$ becomes low, i.e., the signal $\overline{S}$ is turned to the low level. In this case, the collector of the transistor $Q_3$ is changed from the high level to the low level prior to the change from the high level to the low level at the point $P_1$. Accordingly, first, the current flows from the base of the transistor $Q_7$ to the collector of the transistor $Q_3$ through the diode $D_1$. After a short time, the current flows from the base of the transistor $Q_7$ to the collector of the transistor $Q_6$ through the diode $D_2$. The transistor $Q_7$ can be turned off by this first current flow through the diode $D_1$ before the strobe signal $\overline{S}$ is turned from the high level to low level.

Figure 4B:
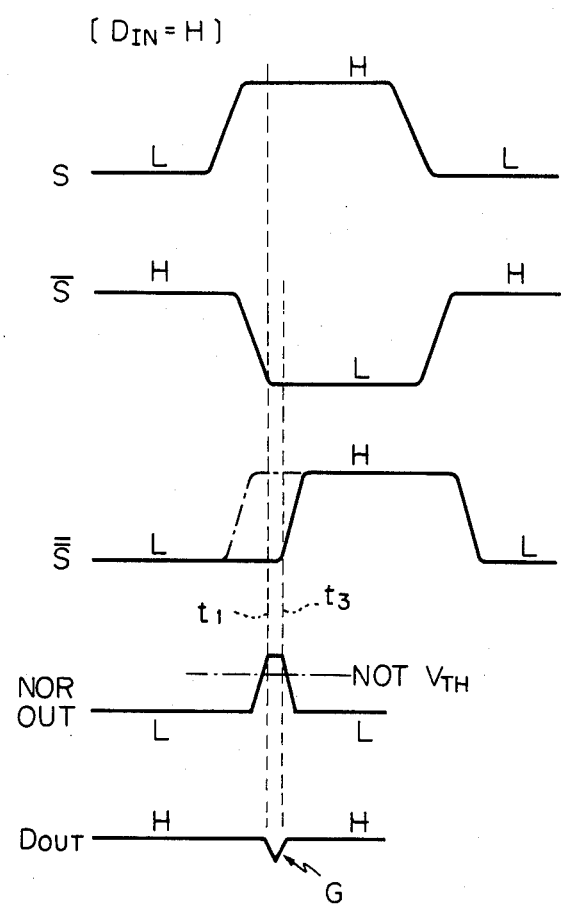
FIG. 4B is a timing chart explaining each strobe signal of the gate circuit shown in FIG. 3.

Meanwhile, no diode $D_1$ is provided in the conventional gate circuit. Only the diode $D_2$ is provided in the gate 2 as shown in FIG. 2. Accordingly, the turning-off timing of the transistor $Q_7$ in the conventional gate circuit is slower than that of the circuit according to the present invention. Consequently, the change from the low level to the high level of the strobe signal $\overline{\overline{S}}$ according to the conventional gate circuit is effected in a period ($t_2-t_1$) as shown in FIG. 4A, while the change from the low level to the high level of the strobe signal $\overline{\overline{S}}$ according to the present invention is effected in a shorter period ($t_3-t_1$) as shown in FIG. 4B. This period ($t_3-t_1$) is considerably shorter than the period ($t_2-t_1$) of the conventional gate circuit as shown in FIG. 4A.

Since the low-level timing of both strobe signals $\overline{S}$ and $\overline{\overline{S}}$ is very short, i.e., the time lag is very small, the level of the glitch noise G is very small. This level is reduced below the threshold level of the SRL circuits. This small-level glitch noise G does not cause data errors in the CPU and other circuits.

Moreover, as shown in FIG. 4B with chain dotted lines, the changeover timing of the strobe signal $\overline{\overline{S}}$ becomes outwardly faster than that of the solid line of the signal $\overline{\overline{S}}$, because the slope characteristic of the change of the strobe signal $\overline{S}$ from the high level to the low level is gentle when the number of loads (number of SRL circuits) exceeds eight loads (n>8).

In this case, no time lag occurs in the signal $\overline{\overline{S}}$ in changeover timing and no glitch noise G occurs from the output $D_{out}$ in the SRL circuit.

Accordingly, the effect of the present invention, i.e., the insertion of the diode $D_1$, is increased together with the increment of the load connected to the gate circuit.

Figure 5A:
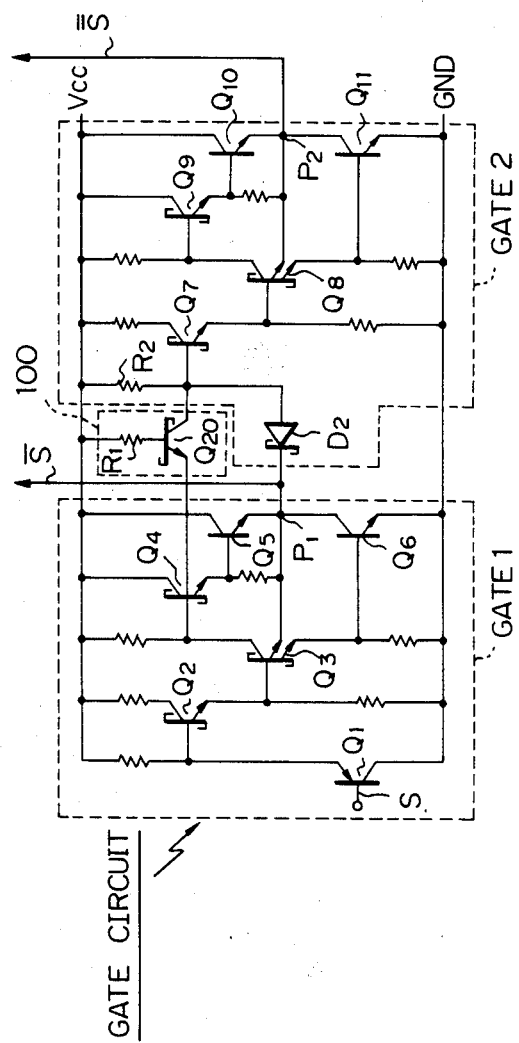
FIGS. 5A, 5B, and 5C are circuit diagrams of a control means according to another embodiment of the present invention.
Figure 5B:
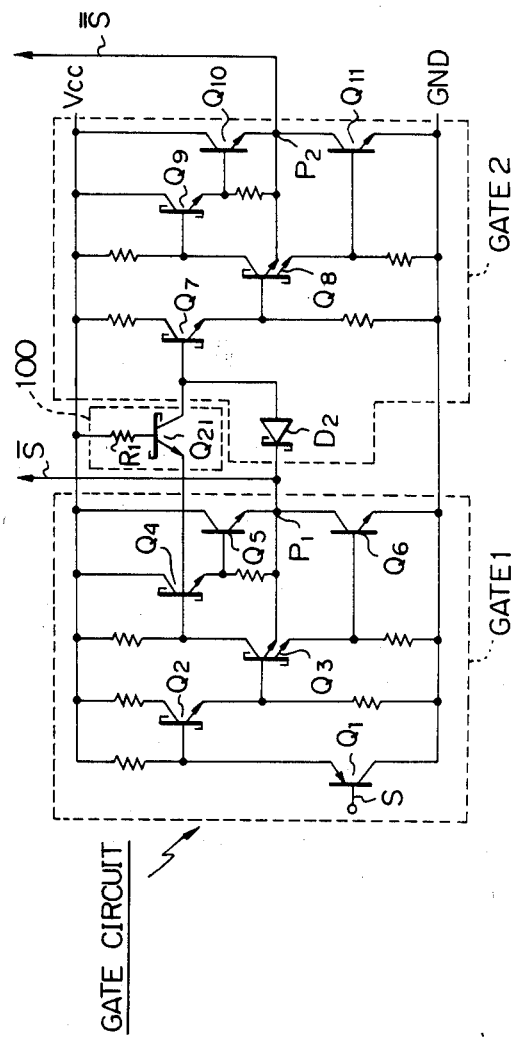
Figure 5C:
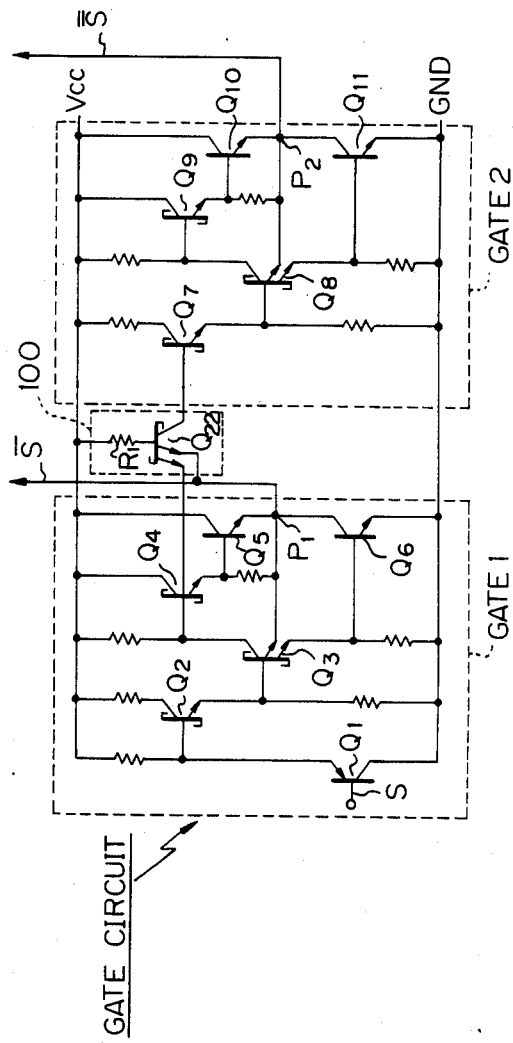

Other embodiments are shown in FIG. 5A, 5B, and 5C with respect to the control means 100.

FIGS. 5A, 5B, and 5C show only part of the circuit diagram of FIG. 3 for explaining the control means 100.

FIG. 5A shows a second embodiment of the control means 100 which includes a transistor $Q_{20}$ and a resistor $R_1$. The collector of the transistor $Q_{20}$ is connected to the input of the second-stage gate 2. The emitter thereof is connected to the collector of the phase-splitter transistor $Q_3$, and the base thereof is connected to the $V_{cc}$ through the resistor $R_1$. This transistor $Q_{20}$ operates as a one-directional element, like diode $D_1$ in FIG. 3.

FIG. 5B shows a third embodiment of the control means 100 of the present invention. In this embodiment, the resistor $R_2$ is omitted from the circuit of FIG. 5A.

FIG. 5C shows a fourth embodiment of the control means 100 of the present invention. In this embodiment, a multiemitter transistor $Q_{22}$ is used as the diodes $D_1$ and $D_2$ in FIG. 3. That is, the second-stage gate circuit 2 includes a TTL circuit instead of the DTL circuit like FIG. 3, 5A, and 5B. Therefore, the transistor $Q_{22}$ is used for an input circuit connected to the output of the first-stage gate 1. The control means 100 includes the transistor $Q_{22}$ and the resistor $R_1$, functioning as a one-directional element.

As explained in the embodiment, the output signals $\overline{S}$, $\overline{\overline{S}}$ of the gate circuit drive the SRL circuit. However, the gate circuit can be used as another circuit which should output the inverted and non-inverted signal $\overline{S}$, $\overline{\overline{S}}$, for example, an address buffer circuit which outputs as inverted address signal and a non-inverted signal provided to the address decoder in a memory device.

We claim:

1. A gate circuit for generating an inverted signal and a non-inverted signal of an input signal, comprising:
   a first-stage gate circuit having a phase splitter transistor operatively coupled to an input terminal for receiving said input signal and for reacting to a change of a level of said input signal and an output circuit controlled by said phase splitter transistor and for outputting at the output terminal thereof said inverted signal;
   a second-stage gate circuit having an input terminal operatively coupled to said output terminal of the output circuit of said first-stage circuit for receiving said inverted signal of said first-stage gate circuit and for outputting said non-inverted signal; and
   means, connected between a collector of said phase splitter transistor in said first-stage gate circuit and an input terminal in said second stage gate circuit, for controlling a level at said input terminal in said second-stage gate circuit according to a level of said collector of said phase splitter transistor in said first-stage gate circuit.

2. A gate circuit as claimed in claim 1, wherein said first-and second-stage gate circuits both comprise transistor-transistor logic circuits.

3. A gate circuit as claimed in claim 1, wherein said first-stage gate circuit comprises a transistor-transistor logic circuit and said second-stage gate circuit comprises a diode-transistor logic circuit.

4. A gate circuit as claimed in claim 1, wherein said first- and second-stage gate circuits both comprise diode-transistor logic circuits.

5. A gate circuit as claimed in claim 1, wherein said first-stage gate circuit comprises a diode-transistor logic circuit and said second-stage gate circuit comprises a transistor-transistor logic circuit.

6. A gate circuit as claimed in claim 1, wherein a plurality of set/reset latch circuits included in an interface circuit are driven by said inverted signal and non-inverted signal both generated by said gate circuit.

7. A gate circuit for generating an inverted signal and a non-inverted signal of an input signal, comprising:
   a first-stage gate circuit having a phase splitter transistor operatively coupled to an input terminal for receiving said input signal and for reacting to a change of a level of said input signal and an output circuit controlled by said phase splitter transistor and for outputting said inverted signal;
   a second-stage gate circuit having an input terminal operatively coupled to said first-stage circuit for receiving said inverted signal of said first-stage gate circuit and for outputting said non-inverted signal; and
   means, connected between a collector of said phase splitter transistor in said first-stage gate circuit and an input terminal in said second stage gate circuit, for controlling a level at said input terminal in said second-stage gate circuit according to a level of said collector of said phase splitter transistor in said first-stage gate circuit, wherein said control means comprises a unidirectional current-conducting element.

8. A gate circuit as claimed in claim 7, wherein said unidirectional current-conducting element comprises a diode.

9. A gate circuit as claimed in claim 7, wherein said unidirectional current-conducting element comprises a resistor and transistor.

10. A gate circuit as claimed in claim 7, wherein said unidirectional current-conducting element comprises a resistor and multiemitter transistor.

11. A gate circuit as claimed in claim 8, wherein said diode comprises a Schottky barrier diode.

* * * * *